(12) United States Patent
Shin et al.

(10) Patent No.: US 8,507,331 B2
(45) Date of Patent: Aug. 13, 2013

(54) METHOD OF ADJUSTING GAP BETWEEN BUMPS IN PIXEL REGION AND METHOD OF MANUFACTURING DISPLAY DEVICE USING THE METHOD

(75) Inventors: Min-Chul Shin, Yongin (KR); Do-Young Kim, Yongin (KR); Yun-Gyu Lee, Yongin (KR); Jong-Moo Huh, Yongin (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/449,068

(22) Filed: Apr. 17, 2012

(65) Prior Publication Data

US 2012/0301985 A1 Nov. 29, 2012

(30) Foreign Application Priority Data

May 26, 2011 (KR) ........................ 10-2011-0050183

(51) Int. Cl.
*H01L 21/00* (2006.01)
(52) U.S. Cl.
USPC ............... 438/151; 438/487; 257/E21.134
(58) Field of Classification Search
USPC .................... 438/151, 487; 257/E21.134
See application file for complete search history.

(56) References Cited

U.S. PATENT DOCUMENTS

| 2006/0151790 A1* | 7/2006 | Kang et al. ............... 257/72 |
| 2010/0112790 A1* | 5/2010 | Sugahara et al. .......... 438/479 |
| 2010/0224881 A1* | 9/2010 | Park et al. ............... 257/71 |

FOREIGN PATENT DOCUMENTS

| JP | 2007-201076 | 8/2007 |
| KR | 10-2003-0044111 | 6/2003 |
| KR | 10-2004-0057968 | 7/2004 |
| KR | 10-2008-0047725 | 5/2008 |

* cited by examiner

*Primary Examiner* — Trung Q Dang
(74) *Attorney, Agent, or Firm* — Knobbe Martens Olson & Bear LLP

(57) ABSTRACT

A method of manufacturing a display device includes forming a buffer layer on a top surface of a substrate, forming an amorphous silicon layer on a top surface of the buffer layer, and forming a polysilicon layer by irradiating the amorphous silicon layer with a laser beam. A plurality of first protrusions are formed on the top surface of the polysilicon layer, and a plurality of second protrusions are formed on a surface of the buffer layer by transferring the shape of the polysilicon layer to the buffer layer. A gate insulator on the buffer layer is then formed in the shape of bumps of the second protrusions.

25 Claims, 11 Drawing Sheets

METHOD OF ADJUSTING GAP BETWEEN BUMPS IN PIXEL REGION AND METHOD OF MANUFACTURING DISPLAY DEVICE USING THE METHOD

CROSS-REFERENCE TO RELATED APPLICATIONS

This application claims priority from Korean Patent Application No. 10-2011-0050183 filed on May 26, 2011 in the Korean Intellectual Property Office, the disclosure of which is incorporated herein by reference in its entirety.

BACKGROUND

1. Field

The present disclosure relates to a method of forming a thin-film transistor (TFT) structure, which can improve light-emitting efficiency, using laser crystallization.

2. Description of the Related Technology

The present disclosure relates to a method of crystallizing amorphous silicon, and a thin-film transistor (TFT) structure manufactured using the method. In a conventional method of crystallizing an amorphous silicon layer into a polysilicon layer, an amorphous silicon layer is formed on a substrate having a buffer layer and then crystallized using excimer laser annealing (ELA) or sequential lateral solidification (SLS), thereby forming a polysilicon layer that functions as a channel region for electrons.

ELA is a method generally used to form polycrystalline silicon. In ELA, an excimer laser beam is instantaneously irradiated for several nanoseconds to melt and recrystallize an amorphous silicon layer without damaging the substrate. Polysilicon is formed at a low temperature that does not melt a glass substrate. In SLS, a silicon surface is completely melted by a laser beam irradiated through spaces between a patterned mask, and then the laser beam is moved to obtain grains extended in the movement direction of the laser beam.

SUMMARY OF CERTAIN INVENTIVE ASPECTS

Embodiments of the present invention relate to manufacturing a TFT panel structure in which appropriate bumps are formed on an organic light-emitting element. Process protrusions in a desired region are spaced apart from each other by a gap desired by a user. These embodiments have been found to represent a substantial improvement over the use of conventional crystallization technology, such as ELA or SLS.

Embodiments disclosed provide a method of improving light-emitting efficiency by forming bumps at desired intervals under a light-emitting region of an organic light-emitting diode by adjusting the energy of a laser beam and the number of shots of the laser beam during laser crystallization.

Aspects of the present invention also provide a method of manufacturing, at low cost, an active matrix organic light-emitting diode panel having superior light-emitting efficiency by providing a thin-film transistor (TFT) structure, in which an organic light-emitting element has a bumpy structure, using a 5-mask process without requiring additional masks.

Aspects of the present invention are not restricted to the ones set forth herein. The above and other aspects of the present invention will become more apparent to one of ordinary skill in the art to which the present invention pertains by referencing the detailed description given below.

According to one aspect, there is provided a method of manufacturing a display device, the method comprising: forming a buffer layer on a top surface of a substrate; forming an amorphous silicon layer on a top surface of the buffer layer; forming a polysilicon layer by irradiating the amorphous silicon layer with a laser beam, where a plurality of first protrusions are formed on a surface of the polysilicon layer; forming a plurality of second protrusions on the top surface of the buffer layer by transferring a shape of the polysilicon layer to the buffer layer; and forming a gate insulator on the buffer layer in a shape of bumps along the second protrusions.

According to another aspect, there is provided a method of manufacturing a display device, the method comprising: crystallizing an amorphous silicon layer formed on a substrate by irradiating the amorphous silicon layer with a laser beam and then forming bumps on a buffer layer of a pixel region using an anisotropic dry etching process; sequentially forming a gate insulator in a shape of bumps, an anode layer in a shape of bumps, and a metal layer for wiring on a top surface of the pixel region and a top surface of a region excluding the pixel region and forming patterns on the metal layer for wiring; forming an interlayer insulating film on top surfaces of regions without the patterns of the metal layer and top surfaces of regions with the patterns of the metal layer and forming contact holes in the interlayer insulating film; and forming source and drain patterns and forming a pixel by removing the metal layer formed on the pixel region using an etching solution which does not react with the anode layer.

BRIEF DESCRIPTION OF THE DRAWINGS

The above and other aspects and features will become more apparent by describing in detail certain embodiments with reference to the attached drawings, in which.

DETAILED DESCRIPTION OF CERTAIN INVENTIVE EMBODIMENTS

Embodiments of the present invention will now be described more fully hereinafter with reference to the accompanying drawings. This invention may, however, be embodied in different forms and should not be construed as limited to the embodiments set forth herein. Rather, these embodiments are provided so that this disclosure will be thorough and complete, and will convey the scope of the invention to those skilled in the art. The same reference numbers generally indicate the same components throughout the specification. In the attached figures, the thickness of layers and regions may be exaggerated for clarity.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illustrate the invention and is not a limitation on the scope of the invention unless otherwise specified.

A bumpy structure of a pixel electrode increases a surface area of the pixel electrode, leading to an increase in a light-emitting area of the pixel electrode. When the pixel electrode has a bumpy structure, the light-emitting area of the pixel electrode is increased, at the same aperture ratio, compared with when the pixel electrode has a flat structure. From the perspective of refractive index, in a conventional organic light-emitting display device, a surface between an anode and a light-emitting element is parallel to a surface between a pixel electrode and a passivation film. In such a structure, light generated at an angle greater than a critical angle is totally reflected. Since an angle of incidence is equal to an angle of reflection, the light cannot escape the surface between the pixel electrode and the passivation film. If a bumpy structure is formed in the pixel region, an angle of reflection of the light generated at an angle greater than the critical angle may change as the light is totally reflected. Accordingly, this can increase the light extraction efficiency of the light-emitting element.

Bumps may not have the same size in all regions. Instead, bumps in a certain region, such as, for example, in an active pattern region, may be larger than those in other regions. If the entire surface is crystallized using conventional crystallization technology such as excimer laser annealing (ELA) or sequential lateral solidification (SLS), only uniform crystallization characteristics are obtained.

Figure 1:
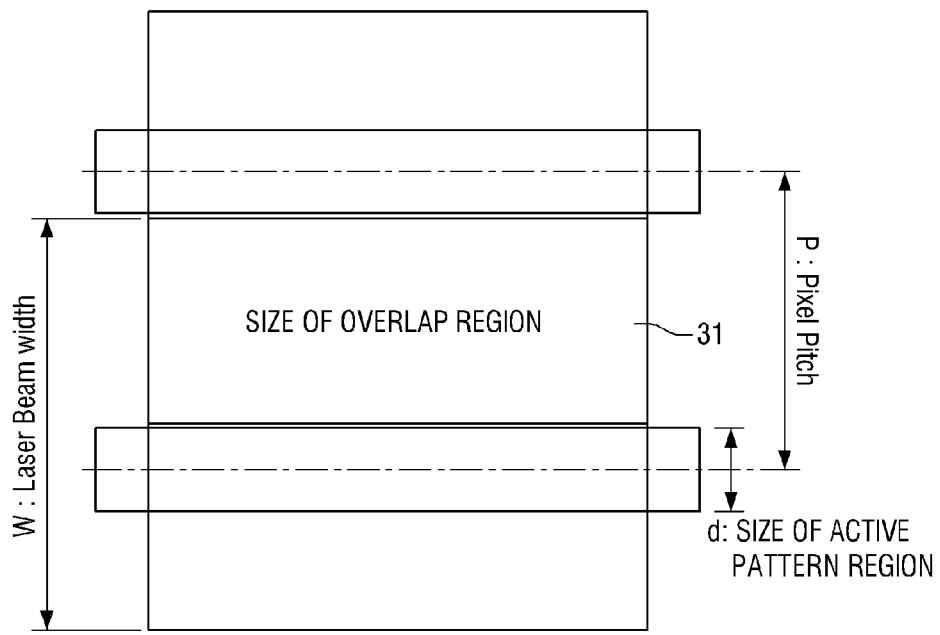
FIG. 1 illustrates an embodiment wherein a gap between protrusions is adjusted by overlapping laser-irradiated regions.
Figure 2:
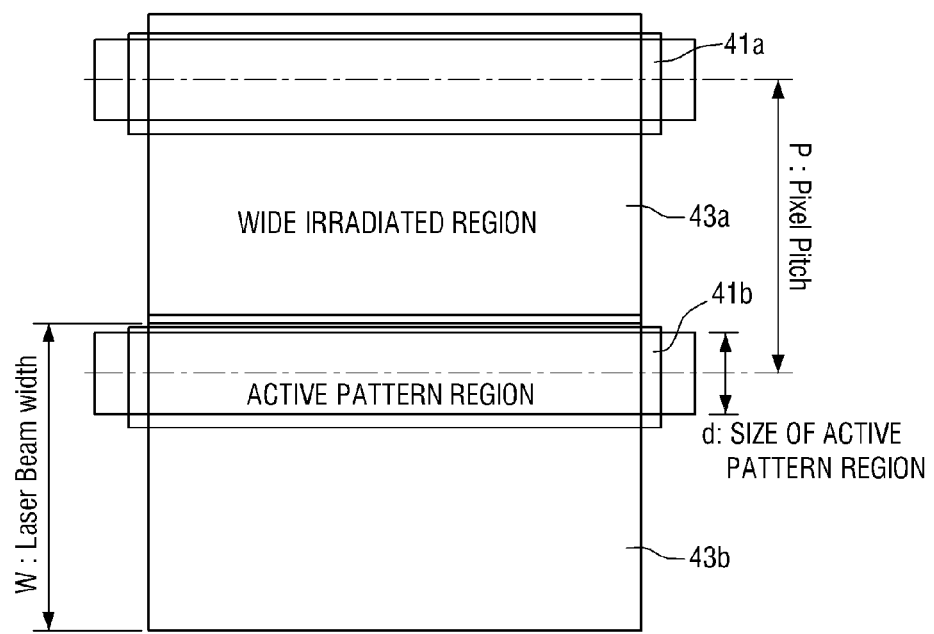
FIG. 2 illustrates an embodiment wherein a gap between protrusions is adjusted by irradiating a certain region with a laser beam having a high energy density.

FIG. 1 illustrates an embodiment wherein a gap between protrusions is adjusted by overlapping laser-irradiated regions. FIG. 2 illustrates an embodiment wherein a gap between protrusions is adjusted by irradiating a certain region with a laser beam having a high energy density.

When a polysilicon layer is formed by irradiating an amorphous silicon layer with a laser beam, protrusions are formed on the polysilicon layer. Referring to FIG. 1, a gap between the protrusions may be adjusted by the number of shots of the laser beam. A region irradiated n times with the laser beam may be referred to as a first region, and a region irradiated m times with the laser beam may be referred to as a second region. If n is smaller than m, a gap between protrusions in the first region irradiated n times is smaller than a gap between protrusions in the second region irradiated m times.

While the laser beam is repeatedly irradiated to the amorphous silicon layer, if a gap between protrusions in an area (corresponding to all or part) of a previously irradiated region needs to be increased, the area may be irradiated again when a current region is irradiated with the laser beam. Accordingly, the gap between the protrusions in this area may be greater than in other areas. A laser beam that can cover the entire area of the first region may be irradiated a plurality of times. In this process, if an area of a previously irradiated first region is irradiated again when a current first region is irradiated with the laser beam, the area may be irradiated a greater number of times than other areas. The area is an overlap region between the previous first region and the current first region. If the overlap region is irradiated m times and if a non-overlap region is irradiated n times, the non-overlap region is the first region, and the overlap region is the second region.

As shown in FIG. 1, a laser beam that can cover a predetermined area is repeatedly irradiated a plurality of times. In this process, an area of a previously irradiated region is irradiated again when a current region is irradiated with the laser beam. Accordingly, an overlap region 31 in which a gap between protrusions needs to be increased is irradiated a greater number of times than other regions to adjust the gap between the protrusions.

The gap between the protrusions can also be adjusted by the energy density of an irradiated laser beam. A laser beam with an increased energy density may be irradiated to a region that requires a greater gap between protrusions than other regions. In this way, the gap between the protrusions can be adjusted.

Two laser beams having different energy densities and covering different sized areas may be used. A first laser beam with a relatively high energy density and a second laser beam with a lower energy density than that of the first laser beam may be used. A region irradiated with the first laser beam may be referred to as a third region, and a region irradiated with the second laser beam may be referred to as a fourth region. The fourth region may be wider than the third region.

Referring to FIG. 2, a laser beam irradiated only to an active pattern region 41a or 41b, and a laser beam irradiated to a region 43a or 43b wider than the active pattern region 41a or 41b may be used. The laser beam irradiated only to the active pattern region 41a or 41b has a higher energy density than the laser beam irradiated to the region 43a or 43b. Thus, a gap between protrusions is greater in the active pattern region 41a or 41b than in other regions. The active pattern region 41a or 41b may be the third region.

Figure 3A:
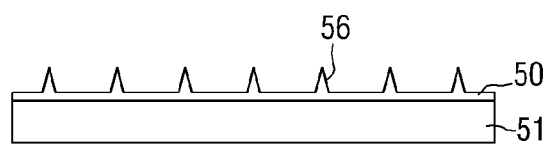
FIGS. 3a through 3c illustrate a change in protrusions resulting from an anisotropic dry etching process.
Figure 3B:
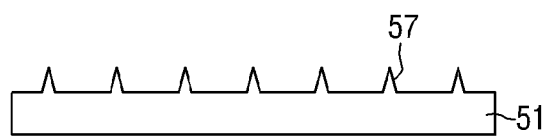
Figure 3C:
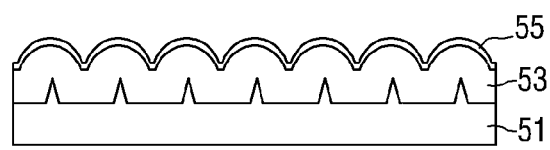

FIGS. 3a through 3c illustrate a change in protrusions according to a dry etch rate. Adjusting an etch rate of a polysilicon layer and an etch rate of a buffer layer may contribute to the formation of bumps.

When the etch rate of the polysilicon layer is greater than that of the buffer layer, some of the protrusions formed on the polysilicon layer may be etched in an etching process. As a result, the protrusions may not remain on the buffer layer or may be reduced in size. If a gate insulator and an anode layer are formed on this buffer layer having such attenuated protrusions, a desired bumpy structure cannot be formed.

The etch rates of the buffer layer and the polysilicon layer can also be adjusted by changing the type of gas used in the etching process. When a chemical etching process is performed using, for example, a chlorine ($Cl_2$) gas, polysilicon is etched faster than silicon dioxide ($SiO_2$) that forms the buffer layer, thus attenuating the protrusions. With this isotropic dry etching method, it is difficult to form protrusions.

Therefore, an anisotropic dry etching process may be performed as shown in FIGS. 3a through 3c. Physical etching may be performed using, for example, an octafluorocyclobutane (C4F8) gas. Thus, referring to FIG. 3a, when a polysilicon layer 50 is removed by etching, protrusions 56 formed on the polysilicon layer 50 by irradiating an amorphous silicon layer with a laser beam may remain intact on a buffer layer 51. Accordingly, referring to FIG. 3b, protrusions 57 are formed on the buffer layer 51. If a gate insulator 53 is formed on this buffer layer 51, a desired bumpy structure can be formed as shown in FIG. 3c due to the protrusions 57 of the buffer layer 51. Then, an anode layer 55 is formed on the gate insulator 53. Consequently, bumps are formed in a pixel region.

After protrusions of a desired size, and spaced apart from each other by a desired gap are formed by adjusting the number of shots of a laser beam and/or the energy density of the laser beam as described above, an anisotropic etching process is performed as described above, thereby forming bumps.

Figure 4A:
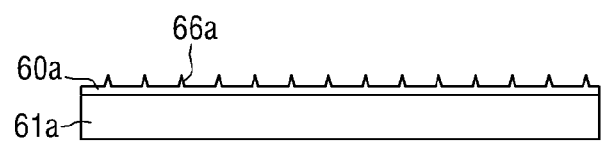
FIGS. 4a through 4c illustrate an embodiment of a process of forming bumps at relatively small intervals.
Figure 4B:
Figure 4C:
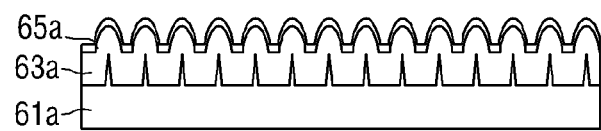
Figure 5A:
FIGS. 5a through 5c illustrate an embodiment of a process of forming bumps at relatively large intervals.
Figure 5B:
Figure 5C:
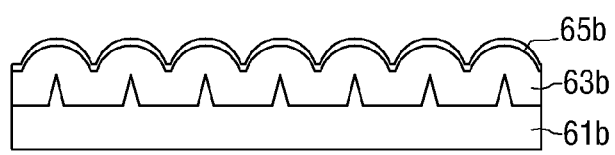

FIGS. 4a through 5c illustrate shapes of bumps (66a, 66b, 67a, 67b) formed using embodiments of a method disclosed herein. FIGS. 4a through 4c illustrate embodiments of a process of obtaining a bumpy structure with a small gap between bumps by reducing the number of shots of a laser beam or reducing the energy density of an irradiated laser beam. To form a bumpy structure with a wide gap between bumps in a certain region, as illustrated in FIGS. 5a through 5c, the number of shots of the laser beam or the energy density of the laser beam may be increased for the region. As a result, a pixel region having a bumpy structure with a relatively wide gap between bumps may be formed as shown in FIG. 5c.

Figure 6:
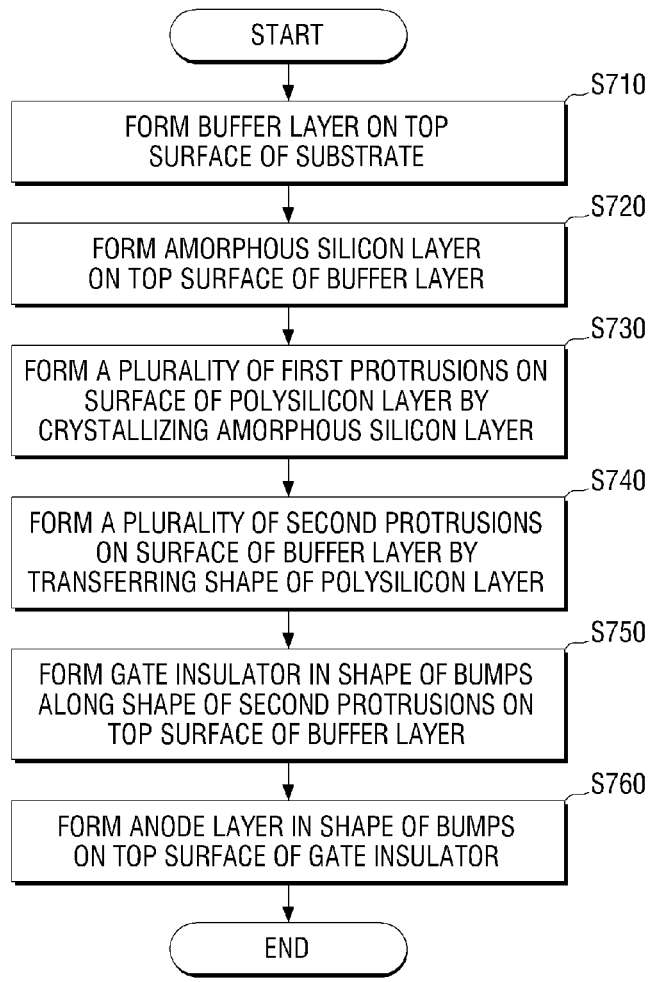
FIG. 6 is a flowchart illustrating an embodiment of a process of forming bumps in a pixel region of a thin-film transistor (TFT) panel.

FIG. 6 is a flowchart illustrating an embodiment of a process of forming bumps in a pixel region of a thin-film transistor (TFT) panel. After a buffer layer is formed on a top surface of a substrate (operation S710), an amorphous silicon layer is formed on the buffer layer (operation S720). Then, the amorphous silicon layer is irradiated with a laser beam to form a polysilicon layer, in which a plurality of first protrusions are formed on the polysilicon layer (operation S730).

While a laser beam covering a predetermined area is repeatedly irradiated a plurality of times, a region in which a gap between protrusions needs to be increased is irradiated a greater number of times than other regions or is irradiated with a laser beam at an increased energy density. Accordingly, the gap between the protrusions in the region can be increased.

Next, the polysilicon layer having the first protrusions is removed by an anisotropic dry etching process. Etch rates of the polysilicon layer and the buffer layer are adjusted such that the first protrusions formed on the polysilicon layer remain on the buffer layer, thereby forming a plurality of second protrusions (operation S740). Adjusting the etch rates can be achieved by changing the type of gas used in the etching process. In some embodiments, a C4F8 gas may be used.

A gate insulator is formed on the buffer layer having the second protrusions. A bumpy structure is formed on the gate insulator by the second protrusions of the buffer layer (operation S750). Then, an anode layer is formed on the gate insulator having the bumpy structure (operation S760). The anode layer formed on the gate insulator also has a bumpy structure.

Figure 8:
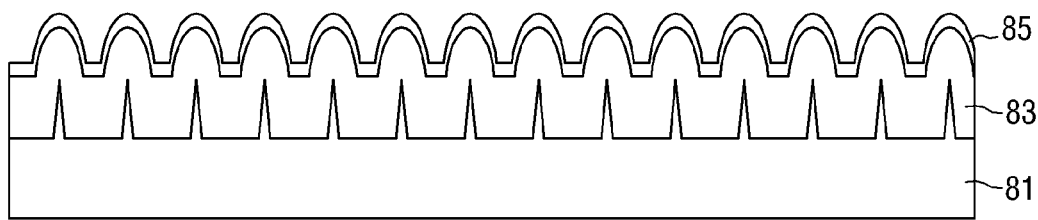
FIG. 8 is an enlarged view of portion 'A' of FIG. 7.
Figure 9:
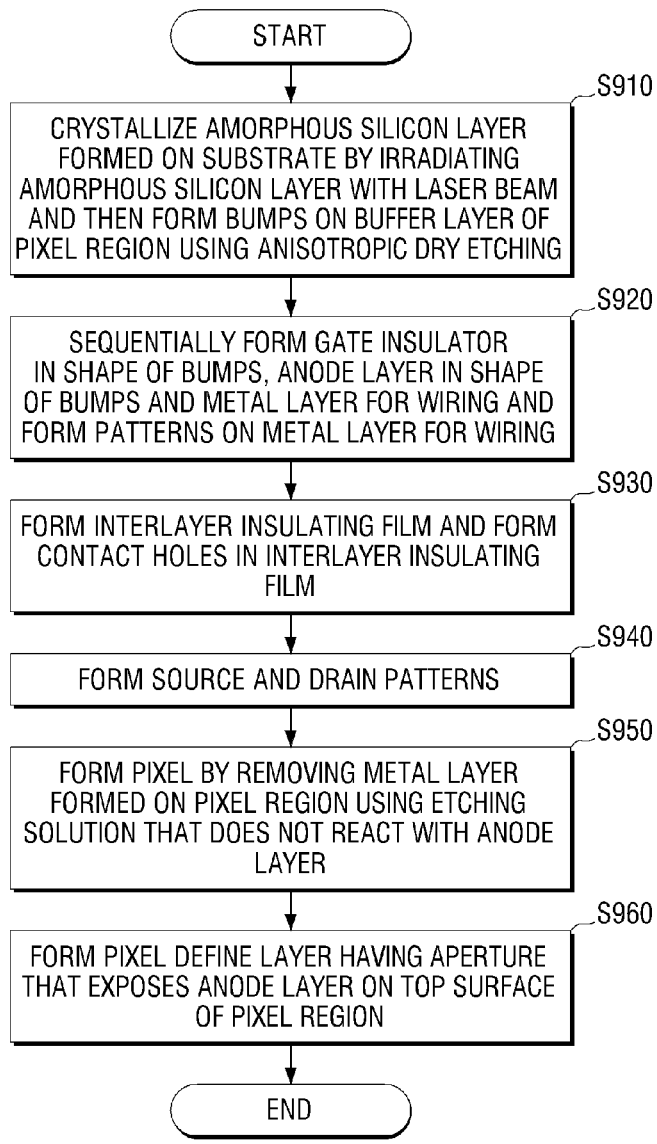
FIG. 9 is a flowchart illustrating an embodiment of a process of forming bumps in a pixel region of a TFT panel.
Figure 10:
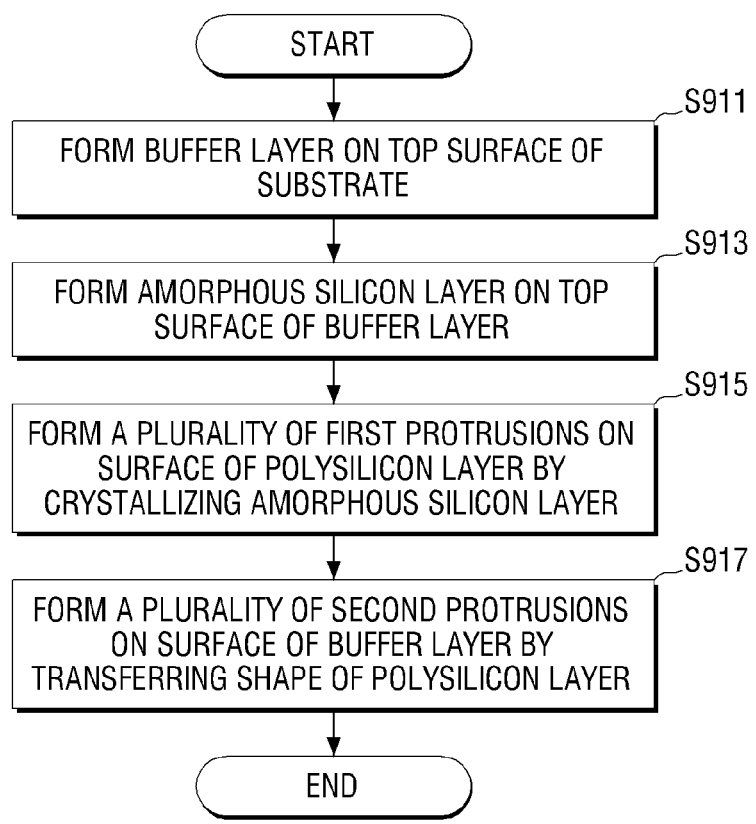
FIG. 10 is a flowchart illustrating an embodiment of a process of forming bumps in a pixel region of a TFT panel.

FIGS. 7a through 7e are cross-sectional views illustrating an embodiment of a series of processes for forming a TFT structure having a bumpy structure. FIG. 8 is an enlarged view of portion 'A' of FIG. 7. FIGS. 9 and 10 are flowcharts illustrating embodiments of a process of forming bumps in a pixel region of a TFT panel.

A method of manufacturing an active matrix organic light-emitting diode (AMOLED) panel such that an organic light-emitting element has a bumpy structure by using a 5-mask process without requiring additional masks will now be described with reference to FIGS. 7a through 10.

Figure 7A:
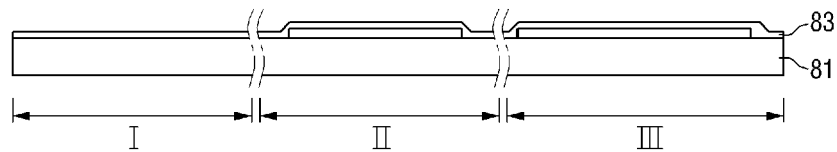
FIGS. 7a through 7e are cross-sectional views illustrating an embodiment of a series of processes for forming a TFT structure having a bumpy structure.

Referring to FIG. 7a, a TFT panel may consist of region I, region II, and region III. The region I may be a pixel region, the region II may be a TFT region, and the region III may be a storage capacitance region.

An amorphous silicon layer may be crystallized with a laser beam, and then bumps may be formed on a buffer layer 81 of the pixel region by an anisotropic dry etching process (such as operation S910 in FIG. 9).

Operation S910 may include forming a buffer layer on a top surface of a substrate (operation S911 in FIG. 10), forming an amorphous silicon layer on the buffer layer (operation S913 in FIG. 10), forming a polysilicon layer by irradiating the amorphous silicon layer with a laser beam, in which a plurality of first protrusions are formed on a surface of the polysilicon layer (operation S915 in FIG. 10), and forming a plurality of second protrusions on a surface of the buffer layer by transferring a shape of the polysilicon layer to the buffer layer (operation S917 in FIG. 10). These operations are the same as operations S710 through S740 described above with reference to FIG. 6, and thus operations S710 through S740 can be referred to for a detailed description of the above operations.

After bumps are formed on the buffer layer 81 of the pixel region in operation S910, a gate insulator 83 is formed in the pixel region and a region excluding the pixel region, that is, in the entire region of the substrate (see FIG. 7a). The gate insulator 83 is formed in the shape of bumps due to the second protrusions.

Figure 7B:
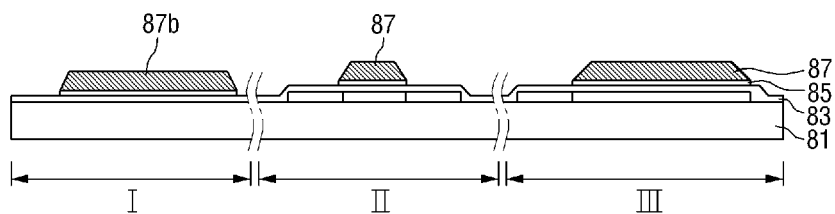

Next, referring to FIG. 7b, an anode layer 85 is formed. The anode layer 85 is also formed in the shape of bumps. Then, a metal layer 87 for wiring is deposited in necessary regions, and patterns are formed on the metal layer 87 for wiring (also see operation S920 in FIG. 9).

Figure 7C:
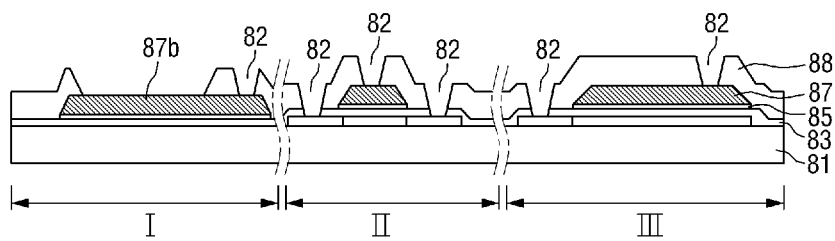
Figure 7D:
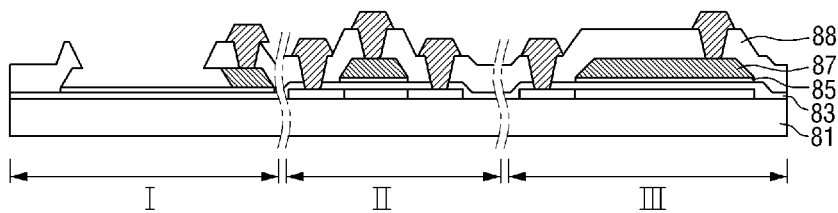

An interlayer insulating film 88 is formed in regions with the patterns of the metal layer and in regions without the patterns of the metal layer, that is, in the entire region of the substrate, and contact holes 82 are formed in the interlayer insulating film 88 (see FIG. 7c and operation S930 in FIG. 9).

Next, source and drain patterns are formed (see operation S940 in FIG. 9). Then, a metal layer 87b formed on the pixel region is removed using an etching solution that does not react with the anode layer 85.

An etching solution that uses oxalic acid as its main component may be used to etch the anode layer 85 only, and such a solution will not react with the metal layer 87b. In certain embodiments, to expose the anode layer 85 formed in the shape of bumps in the pixel region, an etching solution that does not react with the anode layer 85 and reacts only with the metal layer 87b needs to be used. A main component of an etching solution that does not react with the anode layer 85 may be a mixture of phosphoric acid, nitric acid, and acetic acid. In other embodiments, a very small amount of other additives may be added to adjust characteristics.

Figure 7E:
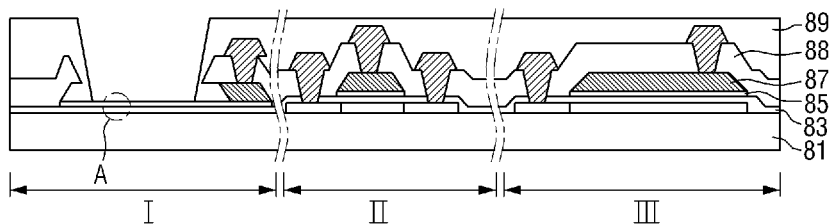

Next, a pixel defining layer 89 having an aperture is formed on a top surface of the pixel region to expose the anode layer 85 formed on the top surface of the pixel region (see FIG. 7e and operation S960 in FIG. 9).

FIG. 8 is an enlarged view of the pixel region exposed through the aperture of the pixel defining layer 89, that is, portion 'A' shown in FIG. 7e. In FIG. 8, the pixel region consisting of the buffer layer 81, the gate insulator 83 and the anode layer 85 is illustrated. The second protrusions are formed on the buffer layer 81, and the gate insulator 83 and the anode layer 85 on a top surface of the buffer layer 81 having a bumpy structure due to the second protrusions. In this bumpy structure, a gap between bumps may be increased or reduced in necessary regions by adjusting the number of shots of a laser beam or the energy density of the laser beam, which has already been described in detail with reference to FIGS. 1 and 2. When a polysilicon layer is formed by irradiating an amorphous silicon layer with a laser beam, a plurality of first protrusions are formed on a surface of the polysilicon layer. The size of the first protrusions and a gap between the first protrusions may be adjusted as desired by adjusting the number of shots of the laser beam and the energy density of the laser beam.

Figure 11:
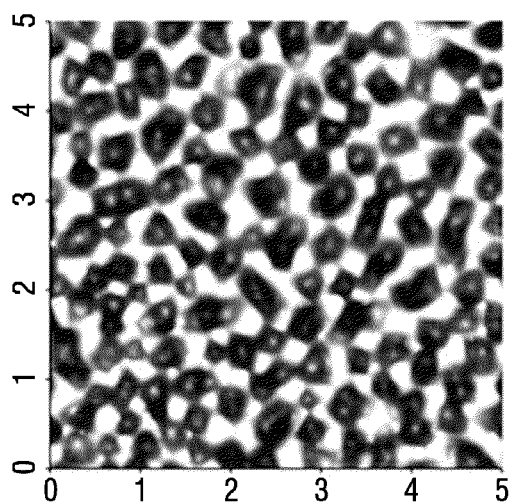
FIG. 11 is a photograph of bumps formed on a surface after crystallization.
Figure 12:
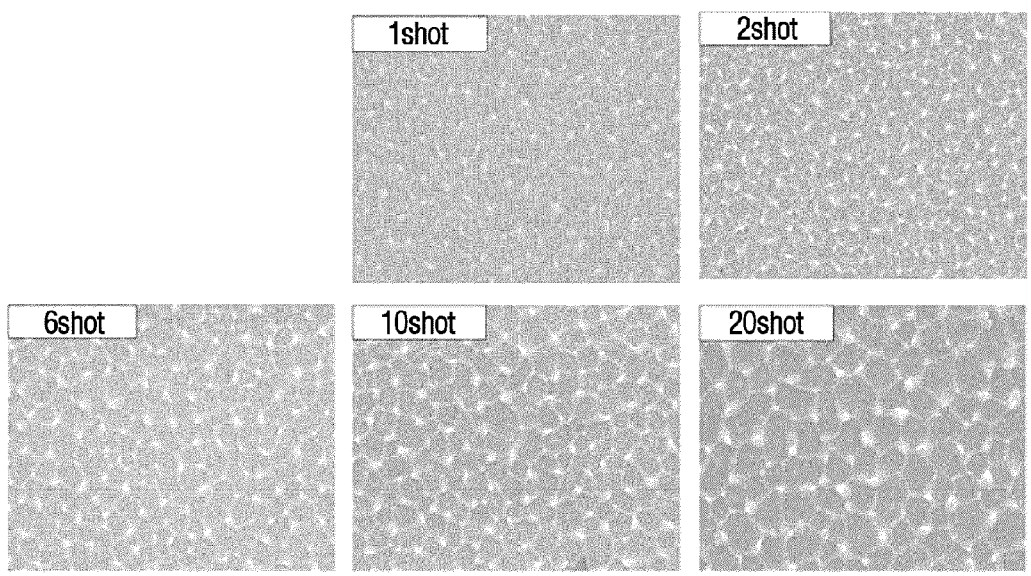
FIG. 12 is an experimental example showing the change in a gap between protrusions with respect to the number of shots of a laser beam.

FIG. 11 is a photograph of bumps formed on a surface after crystallization. FIG. 12 is an experimental example showing the change in a gap between protrusions with respect to the number of shots of a laser beam.

FIG. 11 shows a bumpy structure of a surface that can be observed by atomic force microscopy (AFM) after crystallization. When an amorphous silicon layer is irradiated with a laser beam, protrusions are formed at a grain boundary as shown in FIG. 11.

Referring to FIG. 12, as the number of shots of a laser beam increases, grain size increases, thus increasing a gap between protrusions. In FIG. 12, grain sizes for 1, 2, 6, 10 and 20 shots of the laser beam can be observed. As the number of shots of the laser beam increases, the greater the amount of energy applied to a polysilicon layer, the wider the gap between the protrusions.

In embodiments of a method of adjusting a gap between bumps in a pixel region, bumps are formed at desired intervals under a light-emitting region of an organic light-emitting diode by adjusting the energy of a laser beam and the number of shots of the laser beam during laser crystallization. As a result, light-emitting efficiency can be improved.

In embodiments of a method of forming a TFT panel structure, a TFT structure in which an organic light-emitting element has a bumpy structure can be provided using a 5-mask process without requiring additional masks. Therefore, a method of manufacturing, at low cost, an AMOLED panel having superior light-emitting efficiency can be provided.

While the present invention has been particularly shown and described with reference to certain embodiments thereof, it will be understood by those of ordinary skill in the art that various changes in form and detail may be made therein without departing from the spirit and scope of the present invention as defined by the following claims. The embodiments should be considered in a descriptive sense only and not for purposes of limitation.

What is claimed is:

1. A method of manufacturing a display device, the method comprising:
    forming a buffer layer on a top surface of a substrate;
    forming an amorphous silicon layer on a top surface of the buffer layer;
    forming a polysilicon layer by irradiating the amorphous silicon layer with a laser beam, wherein a plurality of first protrusions are formed on a surface of the polysilicon layer;
    forming a plurality of second protrusions on the top surface of the buffer layer by transferring a shape of the polysilicon layer to the buffer layer; and
    forming a gate insulator on the buffer layer in a shape of bumps along the second protrusions.

2. The method of claim 1, further comprising forming an anode layer along the bumps on the gate insulator.

3. The method of claim 1, wherein a gap between the first protrusions is adjusted by a number of times the laser beam is irradiated.

4. The method of claim 3, wherein the polysilicon layer comprises a first region irradiated n times with the laser beam and a second region irradiated m times with the laser beam, and a gap between first protrusions in the first region is smaller than a gap between first protrusions in the second region, wherein n is a natural number, and m is a natural number greater than n.

5. The method of claim 4, wherein the laser beam covers a predetermined area and is irradiated a plurality of times in an overlapping manner.

6. The method of claim 4, wherein the polysilicon layer comprises a plurality of the first regions, and the second region is an overlap region between the first regions.

7. The method of claim 3, wherein the gap between the first protrusions is adjusted by an energy density of the irradiated laser beam.

8. The method of claim 7, wherein in the forming of the polysilicon layer by irradiating the amorphous silicon layer with the laser beam, a first laser beam and a second laser beam are used, wherein the first laser beam is irradiated to a third region at a first energy density, and the second laser beam is irradiated to a fourth region wider than the third region at a second energy density lower than the first energy density.

9. The method of claim 8, wherein the third region is an active region.

10. The method of claim 1, wherein in the forming of the second protrusions, an anisotropic dry etching process is used.

11. The method of claim 10, wherein the anisotropic dry etching process uses an octafluorocyclobutane (C4F8) gas.

12. A method of manufacturing a display device, the method comprising:
    crystallizing an amorphous silicon layer formed on a substrate by irradiating the amorphous silicon layer with a laser beam and then forming bumps on a buffer layer of a pixel region using an anisotropic dry etching process;
    sequentially forming a gate insulator in a shape of bumps, an anode layer in a shape of bumps, and a metal layer for wiring on a top surface of the pixel region and a top surface of a region excluding the pixel region, and forming patterns on the metal layer for wiring;
    forming an interlayer insulating film on top surfaces of regions without the patterns of the metal layer and top surfaces of regions with the patterns of the metal layer, and forming contact holes in the interlayer insulating film; and
    forming source and drain patterns, and forming a pixel by removing the metal layer formed on the pixel region using an etching solution which does not react with the anode layer.

13. The method of claim 12, further comprising forming a pixel defining layer having an aperture which exposes the anode layer formed on the top surface of the pixel region after the forming of the pixel by removing the metal layer formed on the pixel region.

14. The method of claim 12, wherein the crystallizing of the amorphous silicon layer formed on the substrate by irradiating the amorphous silicon layer with the laser beam comprises:
    forming a buffer layer on a top surface of the substrate;
    forming an amorphous silicon layer on a top surface of the buffer layer;
    forming a polysilicon layer by irradiating the amorphous silicon layer with a laser beam, wherein a plurality of first protrusions are formed on a surface of the polysilicon layer; and
    forming a plurality of second protrusions on a surface of the buffer layer by transferring a shape of the polysilicon layer to the buffer layer.

15. The method of claim 12, wherein in the forming of the gate insulator in the shape of the bumps on the top surface of the pixel region and the top surface of the region excluding the pixel region, the gate insulator is formed in the shape of the bumps along the second protrusions.

16. The method of claim 14, wherein a gap between the first protrusions is adjusted by a number of times the laser beam is irradiated.

17. The method of claim 16, wherein the polysilicon layer comprises a first region irradiated n times with the laser beam and a second region irradiated m times with the laser beam, and a gap between first protrusions in the first region is smaller than a gap between first protrusions in the second region, wherein n is a natural number, and m is a natural number greater than n.

18. The method of claim 17, wherein the laser beam covers a predetermined area and is irradiated a plurality of times in an overlapping manner.

19. The method of claim 17, wherein the polysilicon layer comprises a plurality of the first regions, and the second region is an overlap region between the first regions.

20. The method of claim 14, wherein the gap between the first protrusions is adjusted by an energy density of the irradiated laser beam.

21. The method of claim 16, wherein in the forming of the polysilicon layer by irradiating the amorphous silicon layer with the laser beam, a first laser beam and a second laser beam are used, wherein the first laser beam is irradiated to a third region at a first energy density, and the second laser beam is irradiated to a fourth region wider than the third region at a second energy density lower than the first energy density.

22. The method of claim 17, wherein the third region is an active region.

23. The method of claim 14, wherein in the forming of the second protrusions, an anisotropic dry etching process is used.

24. The method of claim 23, wherein the anisotropic dry etching process uses a C4F8 gas.

25. The method of claim 12, wherein the etching solution which does not react with the anode layer is a mixture of phosphoric acid, nitric acid, and acetic acid.

* * * * *